(12) United States Patent
Hahn et al.

(10) Patent No.: US 11,147,178 B2
(45) Date of Patent: Oct. 12, 2021

(54) PRE-STRAIN UNIT FOR A T-BOLT

(71) Applicant: HENSOLDT Sensors GmbH, Taufkirchen (DE)

(72) Inventors: Marc Hahn, Weissach (DE); Joachim Kanberg, Munich (DE)

(73) Assignee: HENSOLDT Sensors GmbH, Taufkirchen (DE)

( * ) Notice: Subject to any disclaimer, the term of this patent is extended or adjusted under 35 U.S.C. 154(b) by 243 days.

(21) Appl. No.: 16/395,040

(22) Filed: Apr. 25, 2019

(65) Prior Publication Data

US 2019/0335602 A1 Oct. 31, 2019

(30) Foreign Application Priority Data

Apr. 26, 2018 (EP) .................................... 18169635

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *B23P 19/04* | (2006.01) |

(52) U.S. Cl.
CPC ............ *H05K 7/1415* (2013.01); *B23P 19/04* (2013.01)

(58) Field of Classification Search
CPC ...... H05K 7/1415; H05K 7/1401; H05K 7/14; B23P 19/04
See application file for complete search history.

(56) References Cited

U.S. PATENT DOCUMENTS

| | | | |
|---|---|---|---|
| 1,428,138 A | 9/1922 | Brown | |
| 7,795,532 B2* | 9/2010 | Walker | .................... H02B 1/38 |
| | | | 174/50 |
| 2010/0142135 A1 | 6/2010 | Carney et al. | |
| 2017/0302222 A1* | 10/2017 | Aliabadi | ................ E04D 13/00 |

FOREIGN PATENT DOCUMENTS

JP          59-118027 U        8/1984

OTHER PUBLICATIONS

Extended European Search Report issued in European counterpart application No. 18169635.2-1019 dated Nov. 21, 2018 (Nine (9) pages).

* cited by examiner

*Primary Examiner* — Anthony M Haughton
(74) *Attorney, Agent, or Firm* — Crowell & Moring LLP

(57) ABSTRACT

A pre-strain unit for a T-bolt during a release process of two components connected by the T-bolt comprises a slider and a frame for providing a linear guiding for said slider during the release process. The pre-strain unit also includes means for pre-straining said slider in said frame against a head of said T-bolt to keep, during the release process, at least a part of the T-bolt protruding from the two connected components.

6 Claims, 5 Drawing Sheets

PRE-STRAIN UNIT FOR A T-BOLT

CROSS REFERENCE TO RELATED APPLICATIONS

This application claims priority under 35 U.S.C. § 119 from European Application No. 18169635.2, filed Apr. 26, 2018, the entire disclosure of which is herein expressly incorporated by reference.

BACKGROUND AND SUMMARY OF THE INVENTION

The present invention relates to a pre-strain unit for a T-bolt during a release/assembling process of two components (or a T-bolt release unit).

Several electrical components or modules may be squeezed in so-called racks, e.g. in a shelter. The rack itself is integrated into a slot of a main frame, e.g. the shelter's vibration absorber main frame (VAMF), wherein the rack may be fixed into the main frame via hammer-head screws (T-bolt) and corresponding nuts.

FIG. 5 shows an exemplary rack 60 with all modules 80 that is attached to a main frame 70. The hammer-head screws 50 with nuts 51 are located on the left and right top of the main frame 70. The right-hand side of FIG. 5 depicts an enlarged view on this screw connection. The panels of the modules 80 may close the front side of the rack 60 preventing the access to the hammer-head screw 50 through the front side. Unfortunately, the installation of a rack becomes impossible when the slots 90 to the left and right side are also filled up with equipped racks 60 in which case no access is possible from either side.

Hence, if all slots 90 are filled with fully equipped racks 60 and one rack 60 needs to be pulled out or removed for maintenance or similar purposes, the following problem occurs. To get the rack 60 out of the main frame 70, the hammer-head screw 50 on top of the main frame 70 needs to be detached. Obviously, the hammer-head screw 50 may fall down if the nut loosens, because the modules 80 are blocking the access to hold the hammer-head screw 50 in place. The lost screw 50 could moreover cause damage to other electronic parts and, more importantly, there is no way to install a lost hammer-head screw 50 during a later reassembly. Or the whole main frame 70 has to be detached from a supporting wall which is a big effort. Another way would be to disassemble the modules 80 to gain access to the area where the hammer-head screw 50 is located. In any case, this implies a significant effort.

Therefore, there is a demand to simplify the mounting of a given rack 60 to a main frame 70 without encountering the above-mentioned problems.

SUMMARY OF THE INVENTION

At least some of the problems are overcome by a pre-strain unit for a T-bolt according to the claims or methods for releasing/assembling a rack of modules from/to a main frame. The dependent claims refer to further advantageous realizations of the pre-strain unit.

The present invention relates a pre-strain unit for a T-bolt during a release process of two components connected by the T-bolt. The unit comprises: a slider, a frame for providing a linear guiding for the slider during the release process and means for pre-straining the slider the frame against a head of the T-bolt to keep, during the release process, at least a part of the T-bolt protruding from the two components (that were connected prior the release process).

The T-bolt may comprise a threaded portion opposite to the head which is engageable with a nut to establish the connection between the two components. The slider comprise optionally a contact surface adapted to a shape or size of the head of the T-bolt to provide sufficient support.

Optionally, the frame further comprises two opposite guiding parts adapted to receive the head of the T-bolt there between to provide a guidance for the head of the T-bolt when straining the means for pre-straining.

Optionally, the means for pre-straining comprises at least one spring extending between the frame and the slider.

Optionally, the frame further comprises a mounting structure to mount the frame to at least one of the two components (e.g. the rack).

Optionally, the frame and/or the slider comprises a metal (or plastic; dependent on the expected load or stress and the desired lifetime) material.

The present invention relates also to a rack for receiving multiple modules, which is configured to be mounted to a main frame. The rack comprises: a frame structure with at least one opening and a pre-strain unit as described before. The pre-strain unit is mounted or mountable to the frame structure at a position of the opening to get into contact with a T-bolt through the opening and to provide a pre-strain force on the T-bolt. The T-bolt is configured to provide the connection between the rack and the main frame.

The present invention relates also to a method for releasing a rack, optionally filled with modules, from a main frame that are connected by a T-bolt. The rack includes a pre-strain unit as defined before to pre-strain the T-bolt. The method comprises:
  releasing a nut from the T-bolt;
  pushing down the T-bolt into the opening of the rack, thereby moving the slider in a strained position; and
  pulling out the rack from the main frame while keeping—at least temporarily—the T-bolt in the strained position.

The present invention relates also to a method for assembling a rack of modules to a main frame which are to be connected by a T-bolt through an opening of the rack that includes a pre-strain unit as defined before to pre-strain the T-bolt. The method comprises:
  pushing down the T-bolt into the opening of rack, thereby moving the slider in a strained position;
  moving the rack to the main frame while keeping—at least temporarily
  the bolt in the strained position; and
  securing the T-bolt by a nut.

Therefore, embodiments solve at least some of the above-mentioned problems by a T-bolt release unit which keeps a loosened T-bolt in place and provides mechanics that keeps the T-bolt in the screw hole while the rack is pulled out of a main frame compartment. The desired effect is achieved by the pre-straining mechanism that pre-strains the slider which in turn holds the T-bolt after loosening in a particular position. It is further possible that the T-bolt can be pushed into the mounting hole so that the rack can be pulled out or, vice-versa, can be inserted into a slot of the main frame. Therefore, the T-bolt protrudes out of the hole when the fully equipped rack has reached the end position after being pushed into the slot again. Since the T-bolt protrudes out of the hole, also a washer can be mounted easily, and the nut can grip correctly.

Various embodiments of the present invention will be described in the following by way of examples only, and with respect to the accompanying drawings, in which:

DETAILED DESCRIPTION OF THE DRAWINGS

Various examples will now be described more detail with reference to the accompanying drawings in which some examples are illustrated.

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof.

Figure 1:
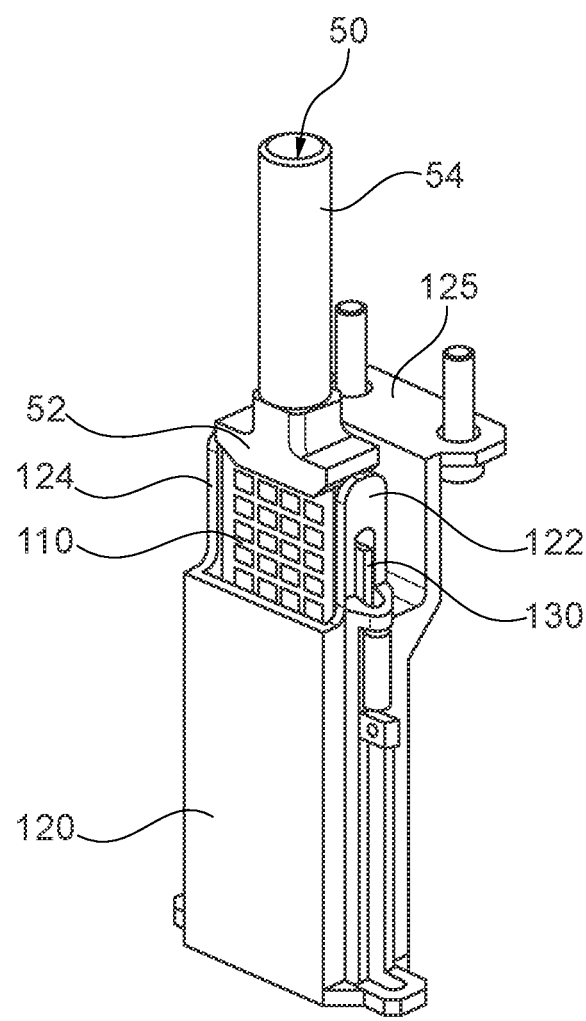
FIG. 1 depicts a pre-strain unit according to an embodiment of the present invention.

FIG. 1 depicts an embodiment of the pre-strain unit for a T-bolt 50 during a release process of two components (not shown) connected by the T-bolt 50. The unit comprises: a slider 110, a frame 120 for providing a linear guiding for the slider 110 during the release process and means 130 for pre-straining the slider 110 in the frame 120 against a head 52 of the T-bolt 50 to keep, during the release process, at least a portion of the T-bolt 50 protruding from the two connected components.

FIG. 1 further depicts the T-bolt 50 placed with its head 52 onto the slider 110 that pushes the T-bolt 50 in the vertical direction upward. In addition, in this embodiment the frame 120 comprises a mounting structure 125 with further screws extending through openings of the mounting structure 125 so that the frame 120 can be secured to the rack at a desired location.

It is understood that the means 130 for pre-straining are strong enough to keep the T-bolt 50 at an upper position as depicted in FIG. 1.

Figure 2:
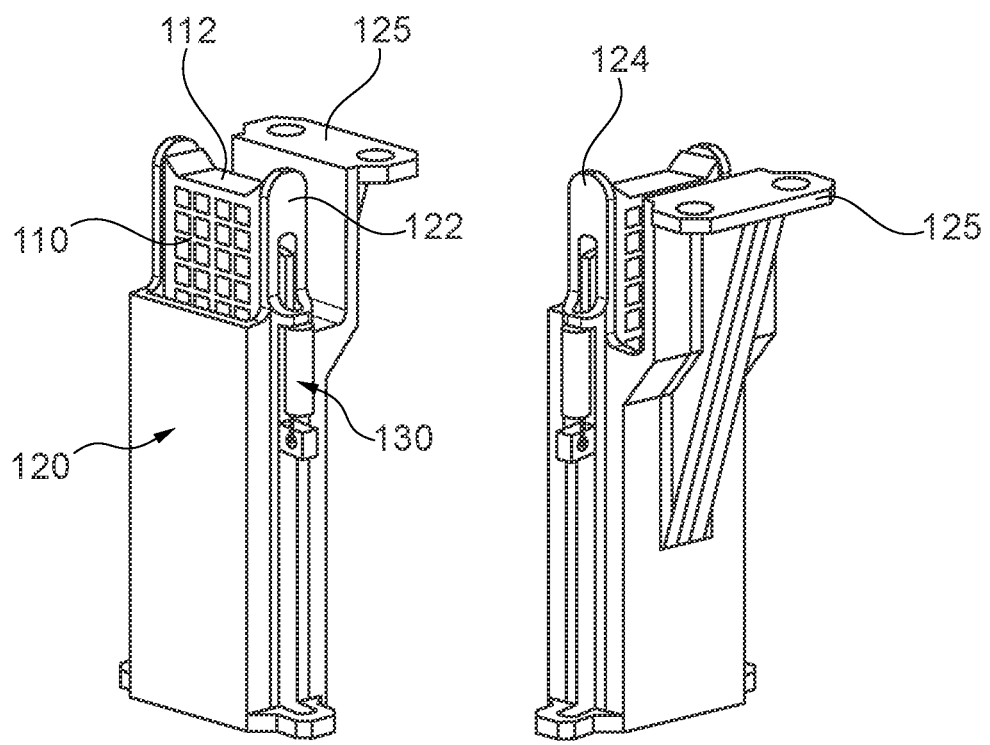
FIG. 2 shows the pre-strain unit of FIG. 1 from different sides.

FIG. 2 shows the pre-strain unit from different sides, wherein the slider 110 is inserted into the frame 120 and exposes a contact surface 112 for contacting the head 52 of the T-bolt 50 after mounting the pre-strain unit to one of the two components. A corresponding a mounting structure 125 is provided. The means 130 for pre-straining include two exemplary springs which, when pushing down the slider 110 via the T-bolt 50, are strained due to the linear movement of the slider 110 into the frame 120. The frame 120 comprises in the upper part two tongue-like extensions 122, 124 which—at least in one direction—are smaller than the body part of the frame 120 and provide a guiding for the slider 110. By this geometry it becomes possible to insert the pre-strain unit easily into a rack at positions, where there is only a limited space available. The form of these guiding portions 122, 124 may be adapted to the concrete available assembly space.

The mounting structure 125 can be adapted to the particular form of the rack and may comprise, for example, holes 126 to receive corresponding screws for mounting the pre-strain unit to an exemplary rack.

Figure 3A:
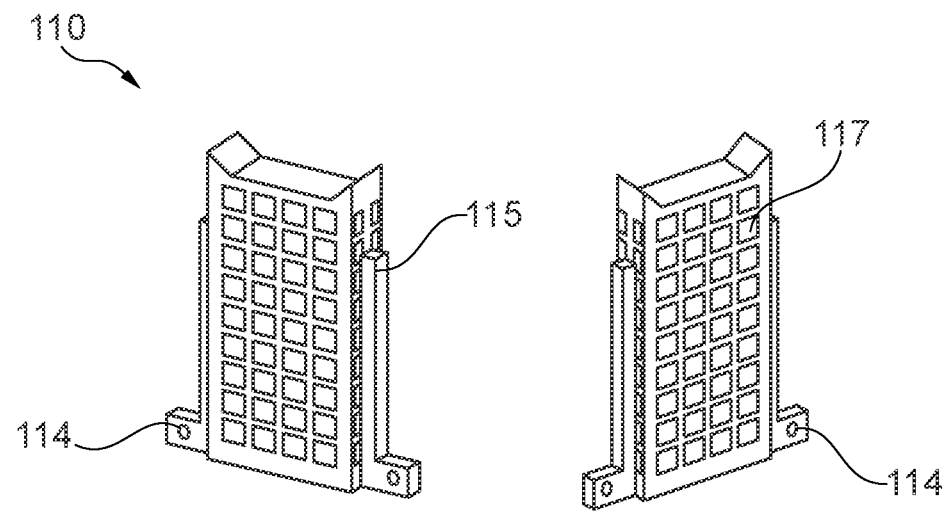
FIGS. 3A, 3B show enlarged pictures of the slider and the frame.
Figure 3B:
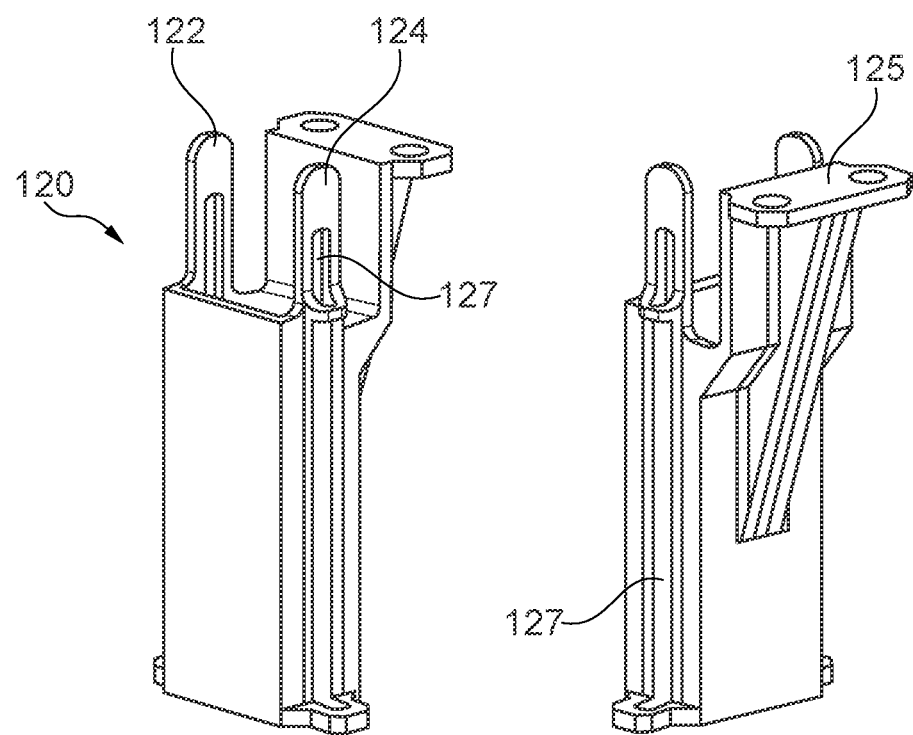

FIGS. 3A, 3B show enlarged pictures of the slider 110 and the frame 120. The slider 110 may comprise openings or lugs 114 for receiving the pre-strain means 130 (e.g., hooks of the springs). The slider 110 may be formed to minimize its weight while providing sufficient stability when pushing the T-bolt 50 together with the slider 110 in a vertical upward position. For example, the slider 110 may comprise a plurality of holes or recesses 117 to lower the weight of the slider 110. The slider 110 may also be formed as a frame or as any kind of structure which is able to transfer the pre-strain force to the head 52 of the T-bolt 50.

Further details of the frame 120 are depicted in FIG. 3B without the slider 110. The opposite guiding parts 122, 124 protrude from the body portion to provide a guiding for the slider 110 when it is inserted into the frame 120. To improve the linear guidance, the guiding parts 122, 124 may comprise longitudinal grooves 127 which receive protruding parts 115 of the slider 110 (see FIG. 3A).

According to embodiments the slider 110 may comprise a rectangular cross-section in the plane perpendicular to the direction of the pre-straining. Same may apply to the head 52 of the T-bolt 50 and the internal space of the frame 120 that receives the slider 110.

Figure 4:
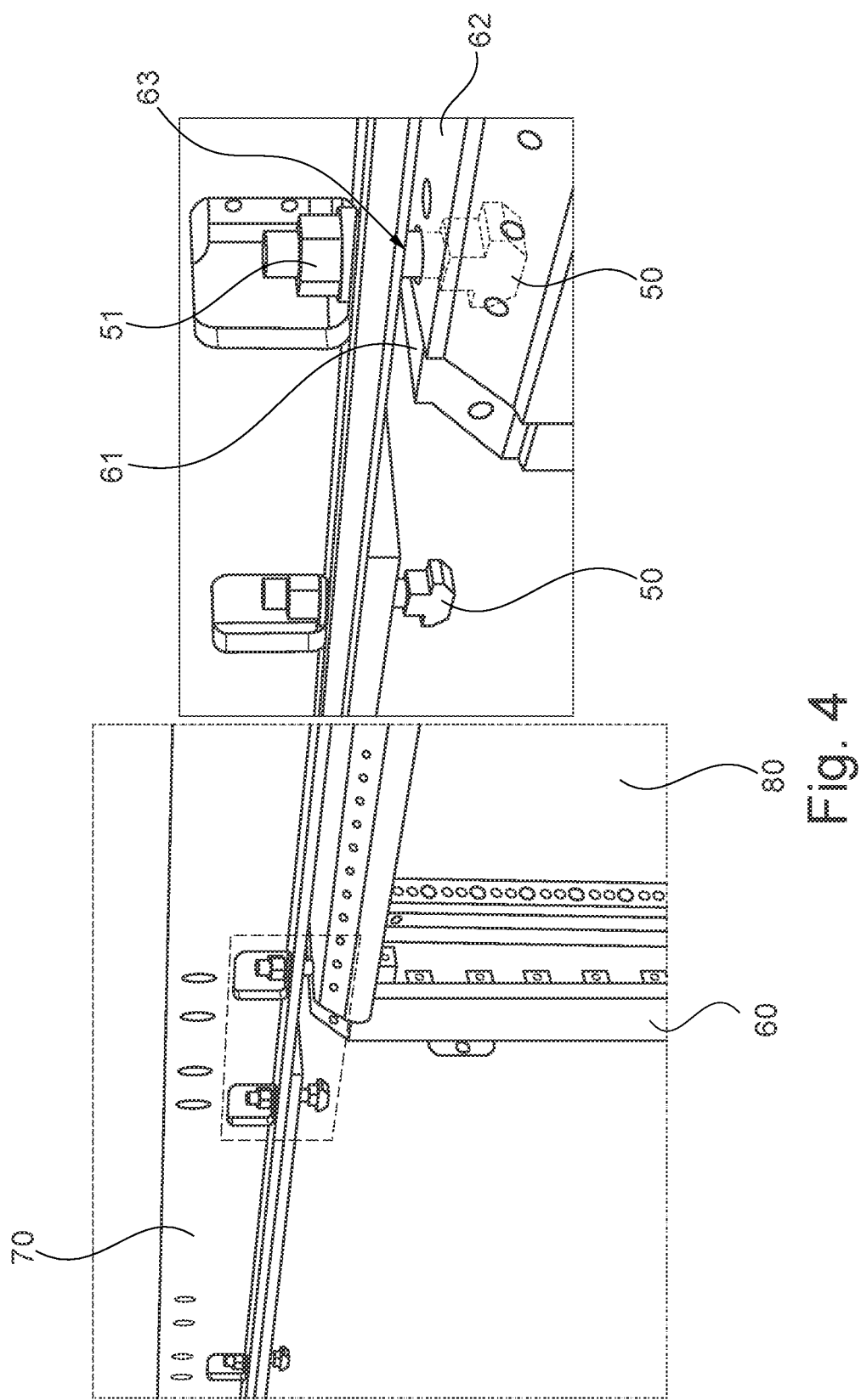
FIG. 4 shows an exemplary rack which is mounted onto a main frame by using a plurality of T-bolts and the pre-strain unit according to embodiments.

FIG. 4 shows an exemplary rack 60 with a frame structure 62 which is mounted onto a main frame 70 by using a plurality of T-bolts 50 which are pre-strained by the installed pre-strain unit according to embodiments of the present invention. The rack 60 and the main frame 70 may be formed as in FIG. 5 and represent examples of the two components that are connected by the T-bolts 50.

Figure 5:
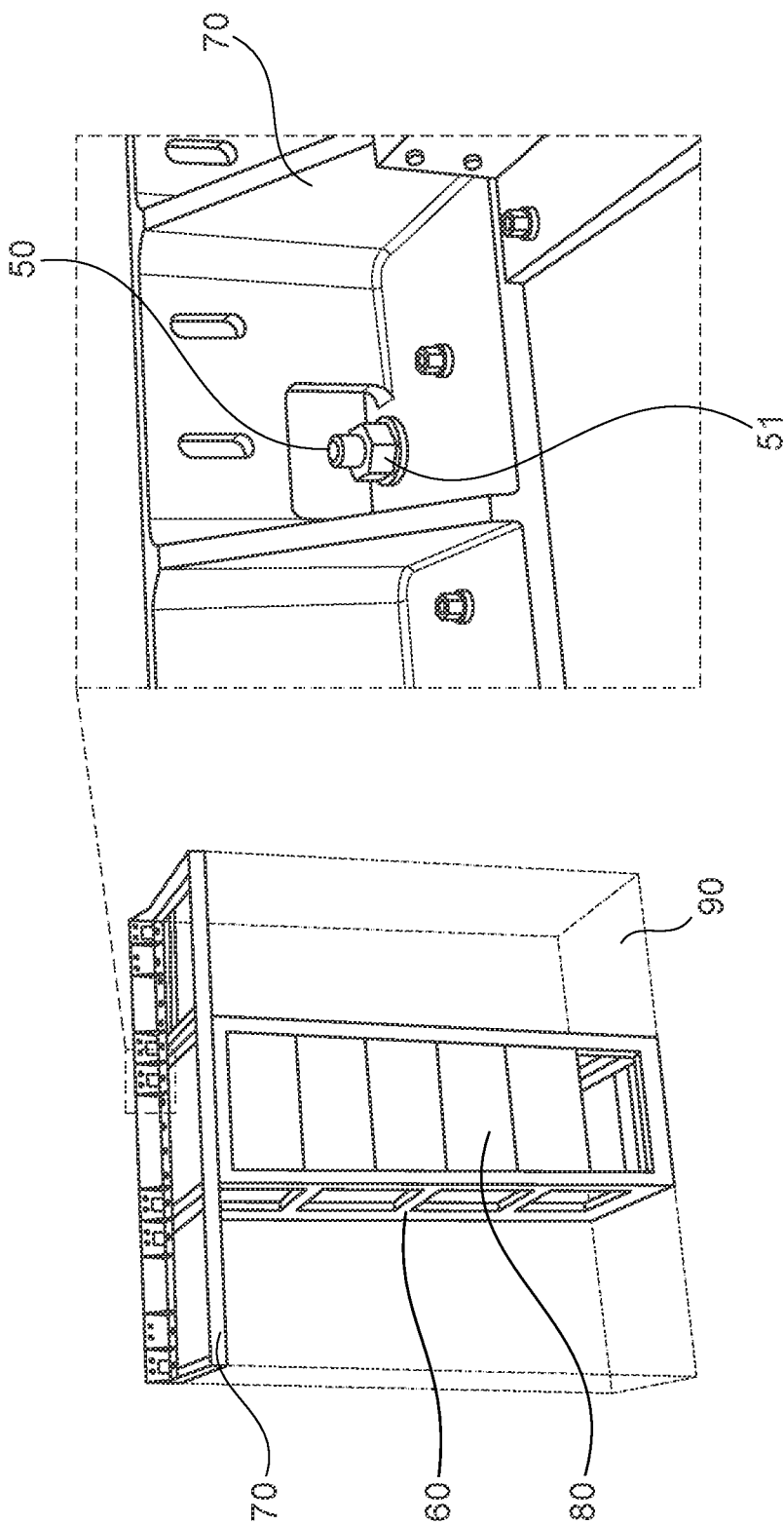
FIG. 5 shows a conventional installation of a rack mounted on a main frame.

The right-hand side in FIG. 4 depicts an enlarged view on an area where the T-bolt 50 connects the rack 60 with the main frame 70. The T-bolts 50 extend through openings 63 of the frame structure 62 and are secured with nuts 51 and optional washers to mount the frame structure 62 to the main frame 70. The depicted rack 60 is shown from a rear side which is typically not accessible when the main frame 70 is installed at a wall resulting in the initially mentioned problem that, during a release process, the T-bolt 50 may fall down if no pre-strain unit is installed. This may not only cause damage to installed modules 80 but may make it impossible to re-install a new T-bolt, e.g. when inserting the rack 60 into a free slot. In the conventional systems as depicted in FIG. 5, the whole rack structure had to be uninstalled and all modules 80 had to be removed. Only then sufficient room would be available to set up sequentially the installation using a new T-bolt or hammer-head screw.

FIG. 4 likewise illustrates the process of releasing/assembling a rack 60 from/to the main frame 70, which is significantly simplified when the pre-strain unit is installed in or at the rack 60. Apparently, if the nut 51 loosens the T-bolt 50 it can be pushed into the hole of the main frame 70. Simultaneously, the slider 110 will be pushed down and the spring(s) 130 of the pre-strain unit will be loaded. If the upper tip of the T-bolt 50 has reached an upper level 61 of the rack 60, the rack 60 can be pulled out of the main frame 70. Because the frame 120 of the pre-strain unit holds the T-bolt 50 (it may be closed, e.g.), the T-bolt 50 cannot be lost while moving the rack 60 out of the main frame 70. Therefore, any damages caused by a falling the T-bolt 50 is prevented when using embodiments of the present invention.

For a re-assembling of a fully equipped rack 60 with modules 80, the process can be performed in the opposite direction. First, the T-bolt 50 is pushed down until the upper tip is equal to the top 61 of the rack 60. Subsequently, the rack 50 is inserted or slip into a shelter of the main frame 70 and pushed to the end position. As soon as the centerline of the T-bolt 50 coincides with the centerline of the hole in the main frame 70, the T-bolt 50 will be pushed upward because of the loaded spring(s) 130 of the pre-strain unit. Therefore, it will pop out over the main frame hole so that washers and the nut 51 can be installed easily. Advantageous aspects of the various embodiments can be summarized as follows:

Embodiments of present invention allow to mount a nut on a positioned hammer-head screw 50—even when an exemplary rack 60 is fully equipped and the hammer-head screw 50 is not accessible anymore.

There is no need to provide additional space between cabinets (to the left or the right), the pre-strain unit according to embodiments nevertheless allows easy mounting/ dismounting.

Embodiments allow further to gain the necessary distance between two rack sides (gangway), because of the new way of mounting. A smallest installation structure of the rack 60 is made possible.

It is further possible to mount/dismount quickly a fully equipped cabinet out of the vibration absorber main frame 70 without disassembling the modules 80 on the racks 60.

While each embodiment may stand on its own as a separate example, it is to be noted that in other embodiments the defined features can be combined differently, i.e., a particular feature described in one embodiment may also be realized in other embodiments. Such combinations are covered by the disclosure herein unless it is stated that a specific combination is not intended.

LIST OF REFERENCE SIGNS

50 T-bolt (hammer-head screw)
51 nut for T-bolt
52 head of the T-bolt
54 threaded part of the T-bolt
60, 70 two components (for example rack and main frame)
61 top/upper level of the rack
62 frame structure
63 at least one opening
80 module(s)
90 slots of the rack
110 slider
112 contact surface
114 openings for the pre-straining means
115 linear guiding protrusion
117 holes/recesses of the slider
120 frame
122, 124 opposite guiding parts
125 mounting structure
126 mounting openings
127 longitudinal groove
130 means for pre-straining

What is claimed is:

1. A pre-strain unit for a T-bolt during a release process of two components connected by the T-bolt, the unit comprising:
   a slider;
   a frame for providing a linear guiding for said slider during the release process; and
   means for pre-straining said slider in said frame against a head of said T-bolt to keep, during the release process, at least a part of the T-bolt protruding from the two components,
   said frame further comprising two opposite guiding parts adapted to receive said head of said T-bolt there between to provide a guidance for said head of the T-bolt when straining the means for pre-straining.

2. The unit of claim 1, wherein the T-bolt comprises a threaded part opposite to said head which is engageable with a nut to establish the connection between said two components,
   said slider comprising a contact surface adapted to a shape or size of said head of said T-bolt.

3. The unit according to claim 1,
   said means for pre-straining comprising at least one spring extending between said frame and said slider.

4. The unit according to claim 1,
   said frame further comprising a mounting structure to mount said frame to at least one of said two components.

5. The according to claim 1, wherein said frame and/or the slider comprising a metal material.

6. A rack for receiving multiple modules and configured to be mounted to a main frame, the rack comprising:
   a frame structure with at least one opening; and
   a pre-strain unit, the pre-strain unit having:
      a slider,
      a frame for providing a linear guiding for said slider during a release process, and
      means for pre-straining said slider in said frame against a head of said T-bolt to keep, during the release process, at least a part of the T-bolt protruding from the rack and main frame,
      said frame further comprising two opposite guiding parts adapted to receive said head of said T-bolt there between to provide a guidance for said head of the T-bolt when straining the means for pre-straining,
   wherein the pre-strain unit is mountable to said frame structure at a position of said opening to receive a T-bolt through said opening and to provide a pre-strain force on the T-bolt, the T-bolt being configured to establish the connection between said rack and said main frame.

* * * * *